(12) United States Patent
Vankayala et al.

(10) Patent No.: US 11,175,007 B1
(45) Date of Patent: Nov. 16, 2021

(54) COMPACT LASER LIGHT ASSEMBLY

(71) Applicant: HONEYWELL INTERNATIONAL INC., Charlotte, NC (US)

(72) Inventors: Gowtham Vankayala, Bangalore (IN); Anita Sure, Bangalore (IN); Gokul Murugesan, Bangalore (IN); Newel Stephens, Urbana, OH (US); Craig Giffen, Urbana, OH (US)

(73) Assignee: HONEYWELL INTERNATIONAL INC., Charlotte, NC (US)

( * ) Notice: Subject to any disclaimer, the term of this patent is extended or adjusted under 35 U.S.C. 154(b) by 0 days.

(21) Appl. No.: 17/156,899

(22) Filed: Jan. 25, 2021

(30) Foreign Application Priority Data

Dec. 7, 2020 (IN) .............................. 202011053133

(51) Int. Cl.
*F21V 5/00* (2018.01)
*F21S 41/16* (2018.01)
*F21K 9/68* (2016.01)
*F21K 9/64* (2016.01)
*F21Y 115/30* (2016.01)

(52) U.S. Cl.
CPC .............. *F21S 41/16* (2018.01); *F21K 9/64* (2016.08); *F21K 9/68* (2016.08); *F21Y 2115/30* (2016.08)

(58) Field of Classification Search
None
See application file for complete search history.

(56) References Cited

U.S. PATENT DOCUMENTS

| 10,281,102 | B2 | 5/2019 | Takahashi et al. |
| 10,458,612 | B2 | 10/2019 | Bhakta |
| 10,520,152 | B2 | 12/2019 | Zozgornik |
| 10,587,090 | B1 | 3/2020 | Raring et al. |
| 2011/0216550 | A1 | 9/2011 | Koike et al. |
| 2014/0022512 | A1 | 1/2014 | Li et al. |
| 2017/0003580 | A1 | 1/2017 | Sheng et al. |
| 2018/0216811 | A1* | 8/2018 | Fukakusa .................. F21V 9/30 |

(Continued)

FOREIGN PATENT DOCUMENTS

| CN | 111552144 A | 8/2020 |
| WO | 2016/064733 A2 | 4/2016 |

OTHER PUBLICATIONS

Kenneth Li, "Laser-excited phosphor light recycling using parabolic relectors," Proc. SPIE 11302, Light-Emitting Devices, Materials, and Applications XXIV, 113021S (Feb. 25, 2020); doi: 10.1117/12.2542244.

*Primary Examiner* — Elmito Breval
(74) *Attorney, Agent, or Firm* — Lorenz & Kopf, LLP

(57) ABSTRACT

A laser light assembly includes a substrate, a reflective phosphor plate, a plurality of laser diodes, a light shield, at least one mirror, a plurality of beam-shaping lenses, and a first lens. The reflective phosphor plate is coupled to the substrate and converts incident blue laser light into white light. The laser diodes emit the blue laser light. The light shield prevents the blue laser light emitted by the laser diodes from escaping the assembly. The mirror reflects the blue laser light emitted from each laser diode toward a predetermined position on the reflective phosphor plate, whereby the reflective phosphor plate emits white light. The beam-shaping lenses are disposed between a different one of the laser diodes and the mirror. The first lens receives the white emitted from the reflective phosphor plate.

19 Claims, 7 Drawing Sheets

(56) References Cited

U.S. PATENT DOCUMENTS

| | | | |
|---|---|---|---|
| 2018/0316160 A1 | 11/2018 | Raring et al. | |
| 2018/0375001 A1* | 12/2018 | Ueno | H01L 33/502 |
| 2019/0097095 A1* | 3/2019 | Yamanaka | G02B 5/0205 |
| 2020/0049317 A1* | 2/2020 | Takahashi | F21S 41/40 |
| 2020/0200363 A1 | 6/2020 | Harrison et al. | |
| 2020/0263850 A1* | 8/2020 | Kawaguchi | G02B 26/101 |
| 2021/0054985 A1* | 2/2021 | Hara | F21S 41/43 |

* cited by examiner

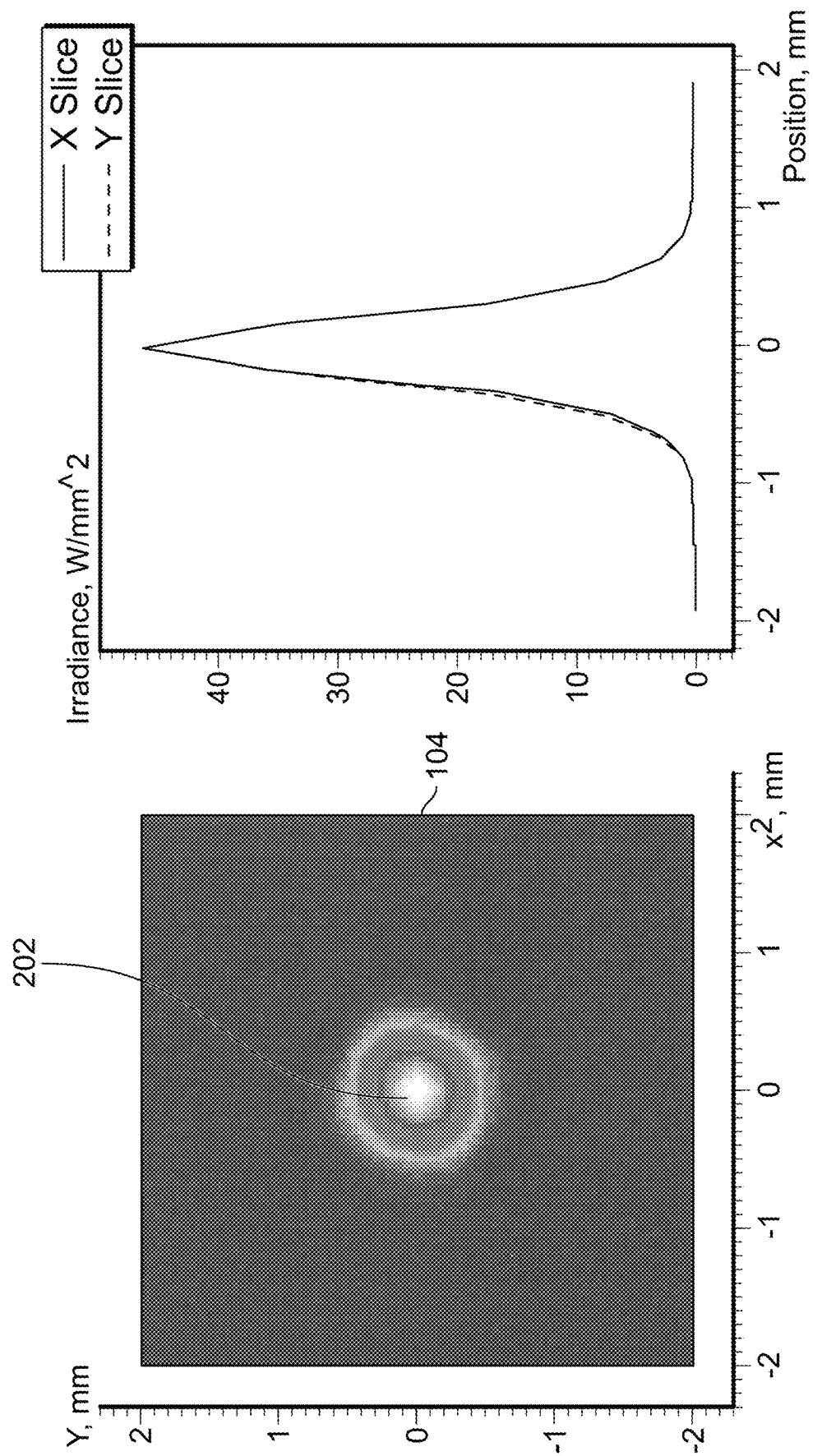

COMPACT LASER LIGHT ASSEMBLY

CROSS REFERENCE TO RELATED APPLICATION

The present application claims benefit of prior filed Indian Provisional Patent Application No. 202011053133, filed Dec. 7, 2020, which is hereby incorporated by reference herein in its entirety.

TECHNICAL FIELD

The present invention generally relates to laser light assemblies, and more particularly relates to a compact laser light assembly that includes multiple laser diodes.

BACKGROUND

Various types of lights are mounted on various types of vehicles, including various types of terrestrial vehicles, various types of marine craft, and various types of aircraft. The purpose of the lights may also vary. For example, the lights may function as headlights, brake lights, navigation lights, takeoff and landing lights, or searchlights. Depending on the end-use, the light products that are presently available may be relatively large, heavy, and expensive.

In the case of searchlights, for example, the size is relatively large because these devices typically use relatively large, high-output light sources, such as light emitting diodes (LEDs), halogen lamps, and HID\Xenon tubes, and thus rely on relatively large optics to create a narrow beam. For example, one particular commercial searchlight product that exhibits exceptional performance, uses a 1600-watt Xenon tube as the light source, is 11-inches in diameter, 18-inches long, and weighs 25.7 pounds. It also requires control boxes and other hardware, with a total system weight up to 70 pounds.

Hence, there is a need for high-output light source that is smaller, weighs less, and is simpler in configuration to existing sources. The present disclosure addresses at least this need.

BRIEF SUMMARY

This summary is provided to describe select concepts in a simplified form that are further described in the Detailed Description. This summary is not intended to identify key or essential features of the claimed subject matter, nor is it intended to be used as an aid in determining the scope of the claimed subject matter.

In one embodiment, a laser light assembly includes a substrate, a reflective phosphor plate, a plurality of laser diodes, a light shield, at least one mirror, a plurality of beam-shaping lenses, and a first lens. The reflective phosphor plate is coupled to the substrate and is configured to convert incident blue laser light into white light. The laser diodes are mounted on the substrate and are evenly spaced about a radius that is measured from a predetermined position on the reflective phosphor plate. Each laser diode is configured to emit blue laser light. The light shield is coupled to the substrate and is configured to prevent the blue laser light emitted by the plurality of laser diodes from escaping the assembly. The at least one mirror is disposed between the light shield and the plurality of laser diodes. The at least one mirror is spaced apart from the plurality of laser diodes and the reflective phosphor plate and is disposed to reflect the blue laser light emitted from each laser diode toward the predetermined position on the reflective phosphor plate, whereby the reflective phosphor plate emits white light. The beam-shaping lenses are mounted on the substrate, and each beam-shaping lens is disposed between a different one of the laser diodes and the at least one mirror. The first lens is mounted on the light shield. The first lens is spaced apart from the reflective phosphor plate and is disposed to receive the white emitted from the reflective phosphor plate.

In another embodiment, a laser light assembly includes a substrate, a reflective phosphor plate, a plurality of laser diodes, a light shield, at least one mirror, a plurality of beam-shaping lenses, a first collimating lens, a lens housing, and a second collimating lens. The substrate has a plurality of openings formed therein that are evenly spaced about a radius that is measured from a predetermined position on the reflective phosphor plate. The reflective phosphor plate is coupled to the substrate and is configured to convert incident blue laser light into white light. Each of the laser diodes is disposed within a different one of the plurality of openings, and each laser diode is configured to emit blue laser light. The light shield is coupled to the substrate and is configured to prevent the blue laser light emitted by the plurality of laser diodes from escaping the assembly. The at least one mirror is disposed between the light shield and the plurality of laser diodes. The at least one mirror is spaced apart from the plurality of laser diodes and the reflective phosphor plate and is disposed to reflect the blue laser light emitted from each laser diode toward the predetermined position on the reflective phosphor plate, whereby the reflective phosphor plate emits white light. Each beam-shaping lens is disposed within a different one of the plurality of openings and is disposed between a different one of the laser diodes and the at least one mirror. The first collimating lens is mounted on the shield. The first collimating lens is spaced apart from the reflective phosphor plate and is disposed to receive and collimate the white emitted from the reflective phosphor plate. The lens housing is coupled to the shield. The second collimating lens is mounted at least partially in the lens housing and is spaced apart from the first collimating lens. The second collimating lens is disposed to receive and collimate the white light that passes through the first collimating lens.

In yet another embodiment, a laser light assembly includes a substrate, a reflective phosphor plate, a plurality of laser diodes, a light shield, a plurality of mirrors, a plurality of beam-shaping lenses, a first collimating lens, a lens housing, and a second collimating lens. The substrate has a plurality of openings formed therein that are evenly spaced about a radius that is measured from a predetermined position on the reflective phosphor plate. The reflective phosphor plate is coupled to the substrate and is configured to convert incident blue laser light into white light. Each of the laser diodes is disposed within a different one of the plurality of openings, and each laser diode is configured to emit blue laser light. The light shield is coupled to the substrate and is configured to prevent the blue laser light emitted by the plurality of laser diodes from escaping the assembly. Each mirror is associated with and is spaced apart from a different one of the plurality of laser diodes. Each mirror is disposed to reflect the blue laser light emitted from its associated laser diode toward the predetermined position on the reflective phosphor plate, whereby the reflective phosphor plate emits white light. Each beam-shaping lens is disposed within a different one of the plurality of openings and is disposed between a different one of the laser diodes and the at least one mirror. The first collimating lens is mounted on the shield. The first collimating lens is spaced apart from the reflective phosphor plate and is disposed to receive and collimate the white emitted from the reflective phosphor plate. The lens housing is coupled to the shield. The second collimating lens is mounted at least partially in the lens housing and is spaced apart from the first collimating lens. The second collimating lens is disposed to receive and collimate the white light that passes through the first collimating lens. The blue laser light emitted by each of the plurality of laser diodes is reflected by its associated mirror in an individual elliptical pattern toward the predetermined position on the reflective phosphor plate, and each of the individual elliptical patterns collectively forms a substantially circular pattern at the predetermined position on the reflective phosphor plate.

Furthermore, other desirable features and characteristics of the laser light assembly will become apparent from the subsequent detailed description and the appended claims, taken in conjunction with the accompanying drawings and the preceding background.

BRIEF DESCRIPTION OF THE DRAWINGS

The present invention will hereinafter be described in conjunction with the following drawing figures, wherein like numerals denote like elements, and wherein:

FIG. 6 illustrates the circular pattern that the collective reflected laser light depicted in FIG. 5 forms at the predetermined position on the reflective phosphor plate 104;

FIG. 7 depicts the irradiance versus position profile of the reflected light for the arrangement depicted in FIG. 5.

DETAILED DESCRIPTION

The following detailed description is merely exemplary in nature and is not intended to limit the invention or the application and uses of the invention. As used herein, the word "exemplary" means "serving as an example, instance, or illustration." Thus, any embodiment described herein as "exemplary" is not necessarily to be construed as preferred or advantageous over other embodiments. All of the embodiments described herein are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary, or the following detailed description.

Figure 1:
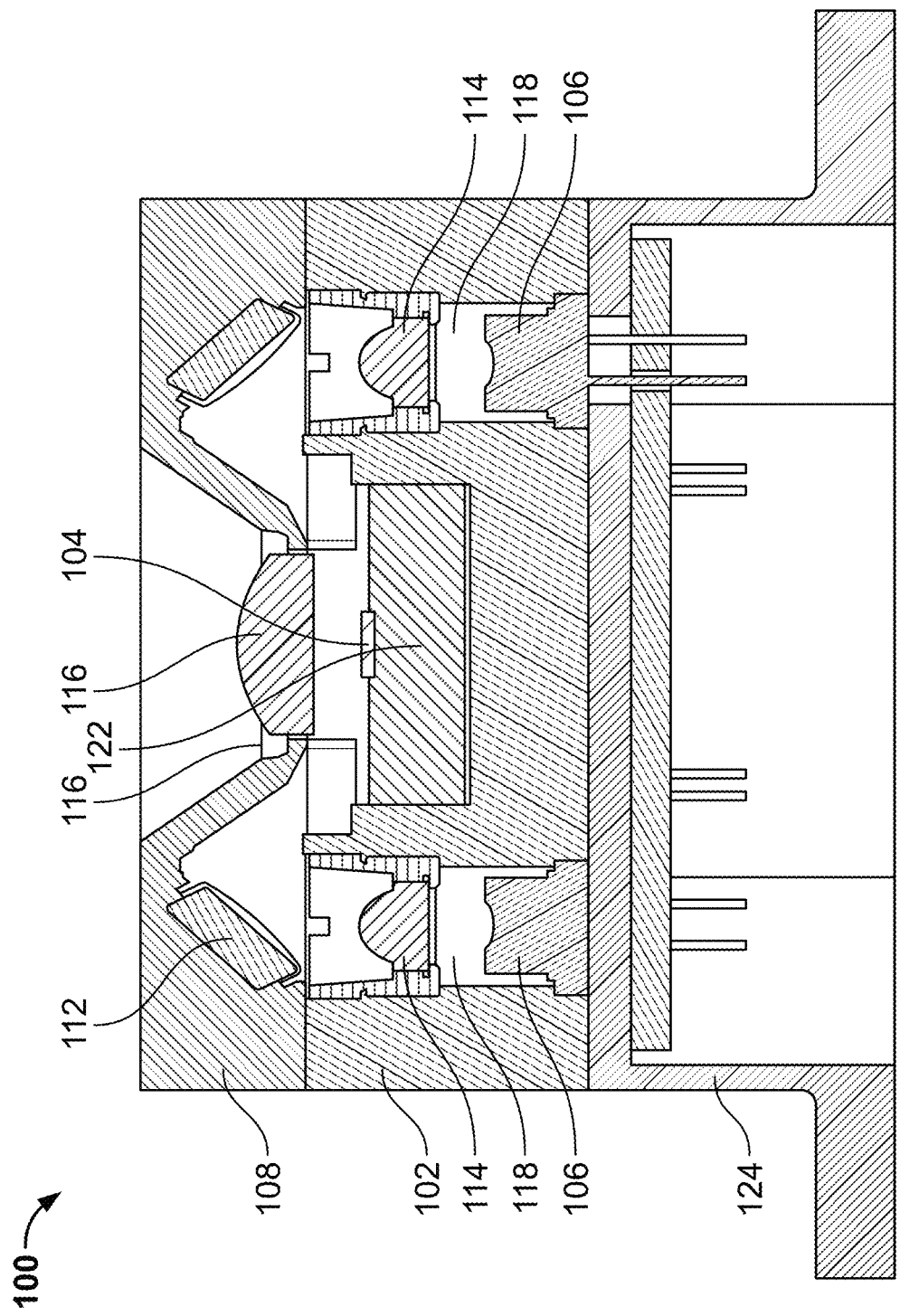
FIG. 1 depicts a cross section view of one embodiment of a compact laser light assembly.

Referring now to FIG. 1, a cross section view of one embodiment of a compact laser light assembly 100 is depicted and includes a substrate 102, a reflective phosphor plate 104, a plurality of laser diodes 106, a light shield 108, at least one mirror 112, a plurality of beam-shaping lenses 114, and a first lens 116. The substrate 102 has a plurality of openings 118 formed therein, and functions as a heat sink. The substrate is thus preferably constructed of a suitable material. Some non-limiting examples of suitable materials include aluminum, various aluminum alloys, copper, steel, and thermally conductive plastics or composites.

The reflective phosphor plate 104 is coupled to the substrate 102 and is configured to convert incident blue laser light into white light. In the depicted embodiment, the reflective phosphor plate 104 is coupled to the substrate 102 via a mount plate 122. The mount plate 122, which may comprise copper, aluminum or any one of numerous thermally conductive materials, is disposed in, and is coupled to, the substrate 102, and has the reflective phosphor plate 104 mounted thereon.

Figure 2:
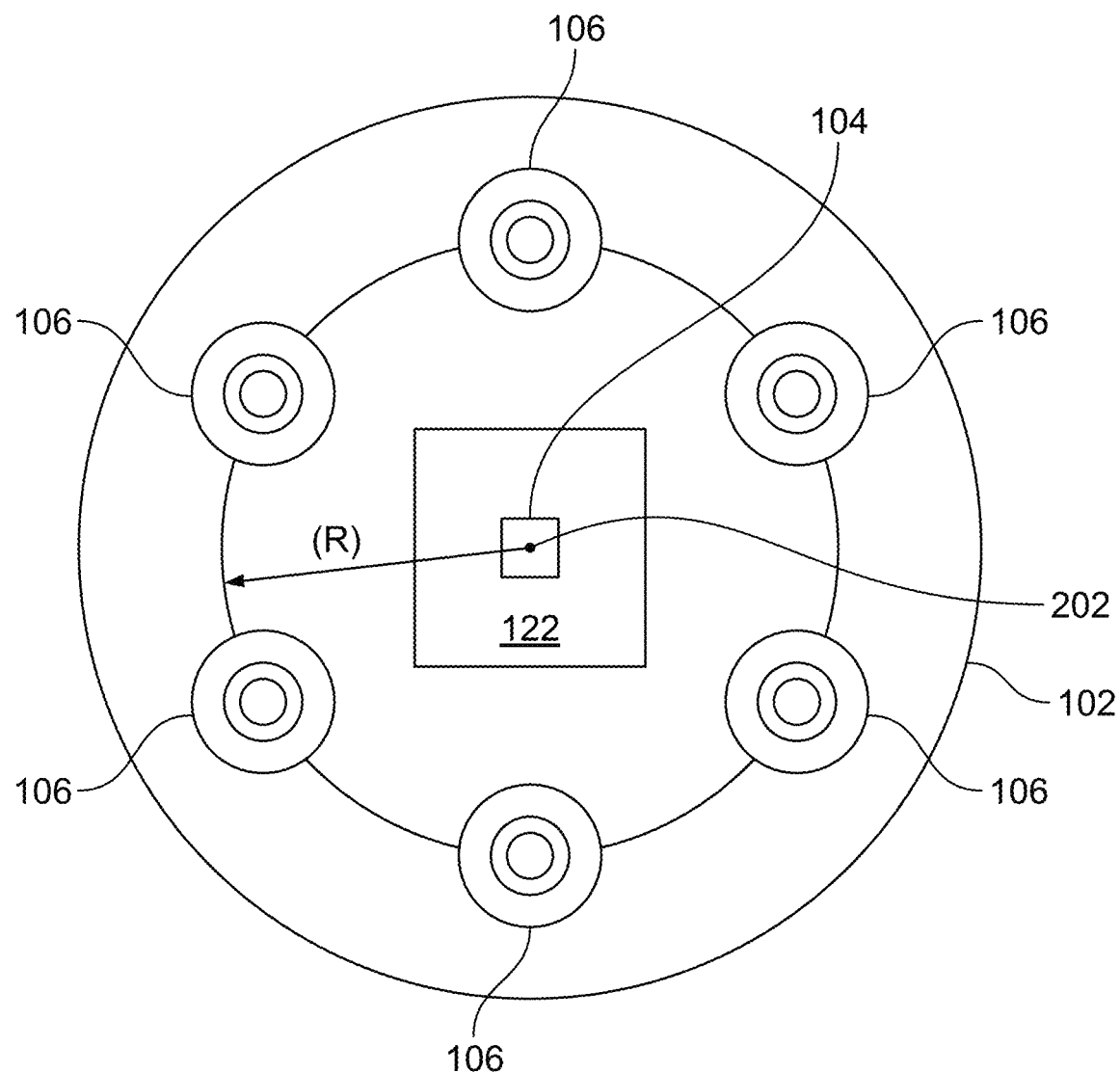
FIG. 2 depicts a top view of a portion of an embodiment of the laser light assembly, showing an arrangement of laser diodes around a reflective phosphor plate.

The laser diodes 106 are mounted on the substrate 102 and, as depicted more clearly in simplified form in FIG. 2, are evenly spaced about a radius (R) that is measured from a predetermined position 202 on the reflective phosphor plate 104. More specifically, at least in the embodiment depicted in FIG. 1, each laser diode 106 is disposed, one each, within a different one of the openings 118 formed in the substrate 102. The laser diodes 106 are each configured, upon being energized, to emit blue laser light. It will be appreciated that the number of laser diodes 106 included in the laser light assembly 100 may vary. In the depicted embodiments, the number of laser diodes is an even number, but the number could also be an odd number. Although the specific number is not depicted in FIG. 1, in the embodiment depicted in FIG. 2, the number of laser diodes 106 is six, and in the embodiment depicted in FIGS. 3 and 5, the number of laser diodes 106 is eight. In other embodiments, the laser light assembly 100 may include more or less than this number of laser diodes.

The light shield 108 is coupled to the substrate 102 and is configured to prevent the blue laser light emitted by the laser diodes 106 from escaping the assembly 100. To implement this functionality, the light shield 108 is suitably shaped, and is formed of a suitable material that is opaque to, and will reflect or absorb, the blue laser light emitted by the laser diodes 106. This prevents stray laser light from escaping the device where it could cause a safety hazard or unwanted blue spots in the final output beam. Some non-limiting examples of suitable materials include steel, aluminum, and various opaque plastic materials. In a particular preferred embodiment, the light shield 108 is formed of aluminum.

The at least one mirror 112 is disposed between the light shield and the plurality of laser diodes 106. In the depicted embodiment, the at least one mirror 112 is mounted on the light shield 108 and is spaced apart from the plurality of laser diodes 106 and the reflective phosphor plate 104. The at least one mirror 112 is disposed to reflect the blue laser light emitted from each laser diode 106 toward the predetermined position 202 on the reflective phosphor plate 104. As a result, and as noted above, the reflective phosphor plate 104 will convert the incident blue laser light into white light. It will be appreciated that the at least one mirror 112 may be implemented using a plurality of mirrors. In one particular embodiment, as depicted more clearly in FIGS. 3, 5, and 8, there is one mirror 112 associated with and spaced apart from each of the laser diodes 106. Each of the mirrors 112 in this embodiment is disposed to reflect the laser light emitted from its associated laser diode 106 toward the predetermined position 202 on the reflective phosphor plate 104.

Referring again to FIG. 1, the beam-shaping lenses 114 are mounted on the substrate 102, and each beam-shaping lens 114 is disposed between a different one of the laser diodes 106 and the at least one mirror 112. In the depicted embodiment, each beam-shaping lens 114 is disposed within a different one of the openings 118 formed in the substrate 102, though these lenses 114 could be disposed external to the openings 118 in other embodiments. Although the beam-shaping lenses 114 may be variously implemented, in a particular preferred embodiment, each is implemented using a focusing lens, which creates the smallest possible spot on the reflective phosphor plate 104.

The first lens 116 is mounted on the light shield 108 and is spaced apart from the reflective phosphor plate 104. The first lens 116 is disposed to receive and collimate the white light emitted from the reflective phosphor plate. Although the first lens 116 may be variously implemented, in a particular preferred embodiment, it is implemented using a collimating lens.

Before proceeding further, it is noted that the depicted laser light assembly 100 may additionally include a mount flange 124. The mount flange 124, when included, is coupled to the substrate 102 and is configured to mount the laser light assembly 100 on a surface (non-illustrated). The surface may vary and may depend on the specific end-use for the laser light assembly 100.

Figure 3:
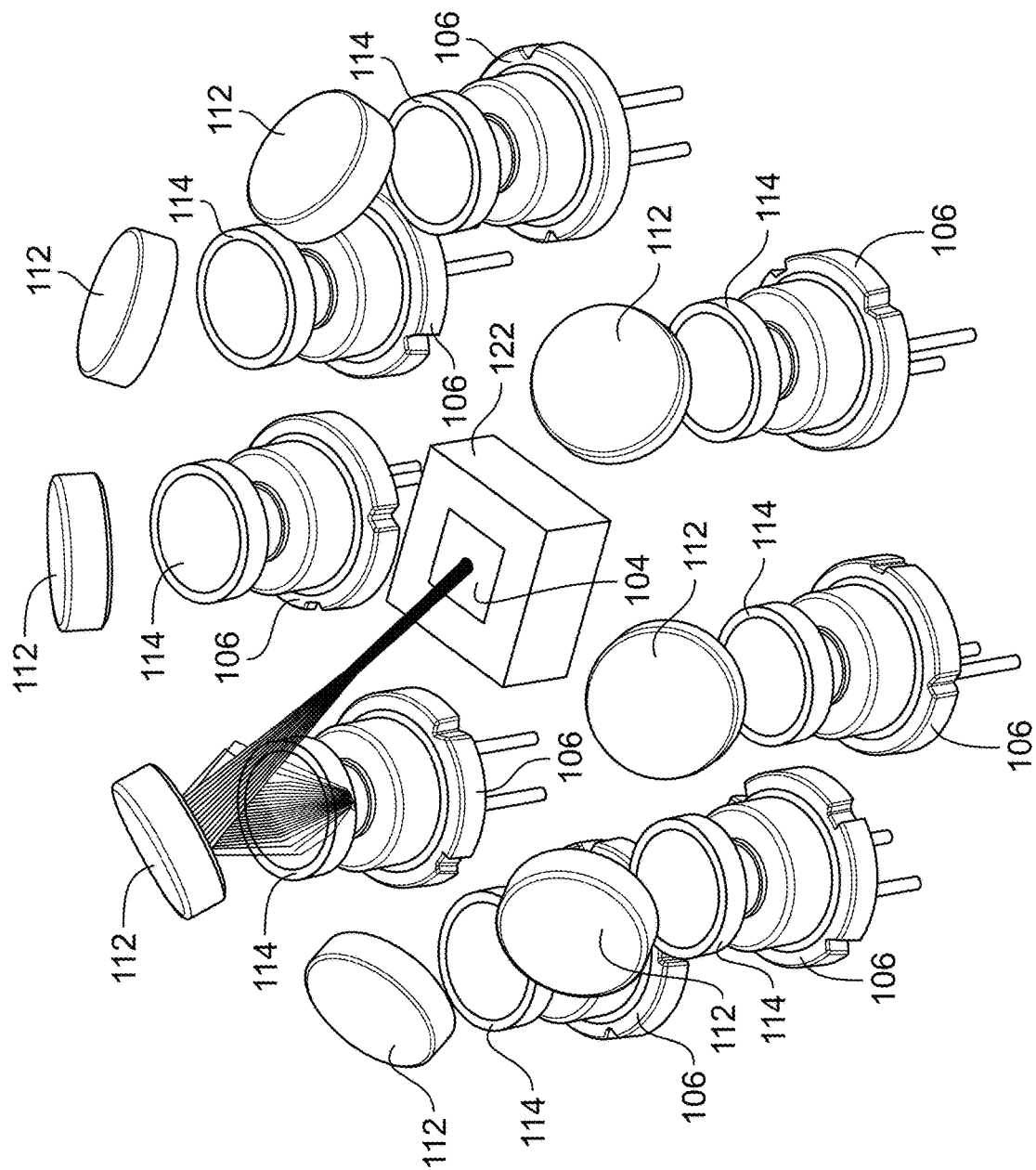
FIG. 3 depicts a perspective view of an arrangement of laser diodes around a reflective phosphor plate, showing how laser light emitted from a single laser diode is reflected onto the reflective phosphor plate
Figure 4:
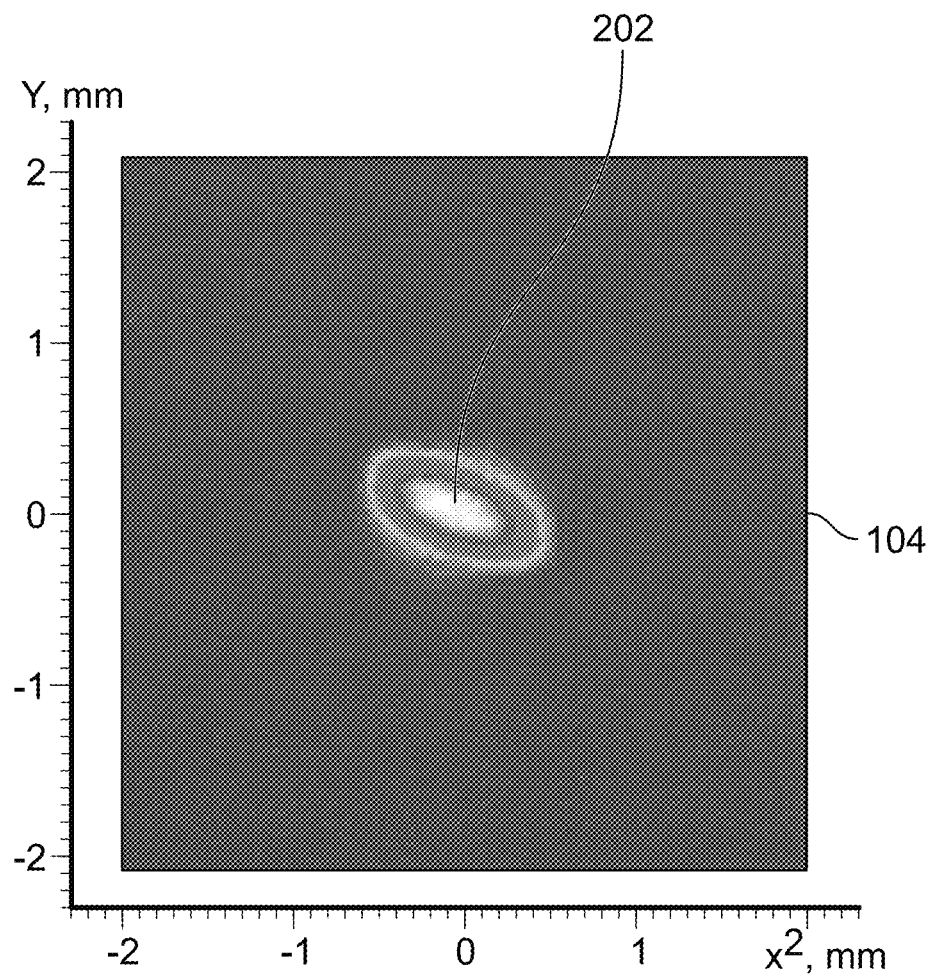
FIG. 4 illustrates the elliptical pattern that the reflected laser light depicted in FIG. 3 forms at a predetermined position on the reflective phosphor plate 104.
Figure 5:
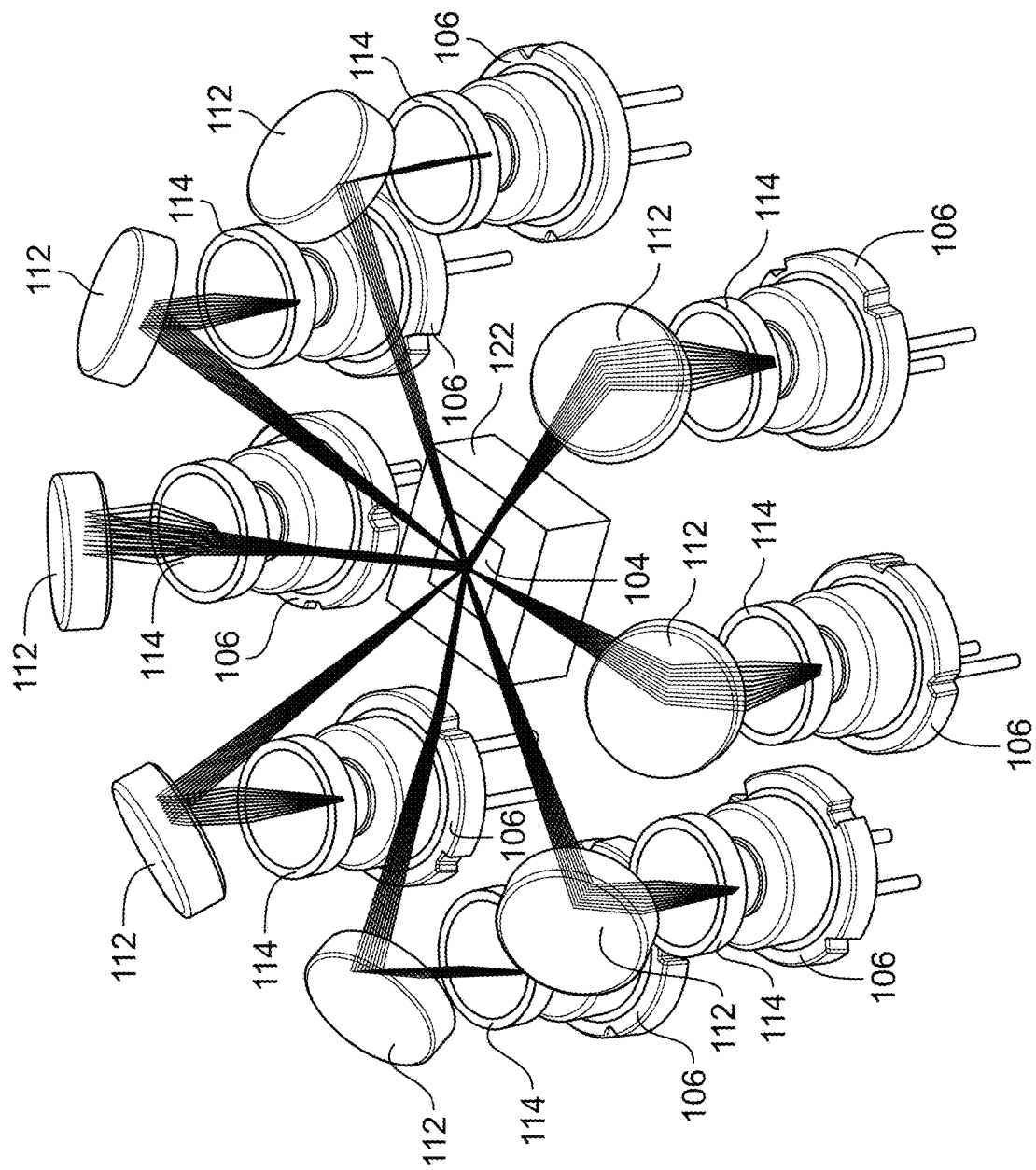
FIG. 5 depicts a perspective view of an arrangement of laser diodes around a reflective phosphor plate, showing how laser light emitted from all of the laser diodes is reflected onto the reflective phosphor plate

With reference now to FIGS. 3 and 4, it is seen that when the blue laser light emitted by each of the plurality of laser diodes 106 is reflected by its associated mirror 112, it is reflected in an elliptical pattern at the predetermined position 202 on the reflective phosphor plate 104. To more clearly illustrate this, FIGS. 3 and 4 depict the resultant pattern when only one of the laser diodes 106 emits blue laser light. However, as FIGS. 5 and 6 depict, when all of the laser diodes 106 are emitting blue laser light, each of the individual elliptical patterns collectively forms a relatively small, substantially circular pattern at the predetermined position 202 on the reflective phosphor plate 104. This ensures, as depicted in FIG. 7, that the white light emitted from the reflective phosphor plate 104 is emitted as a fairly narrow beam. This, in turn, contributes to the compactness of the assembly 100.

Figure 8:
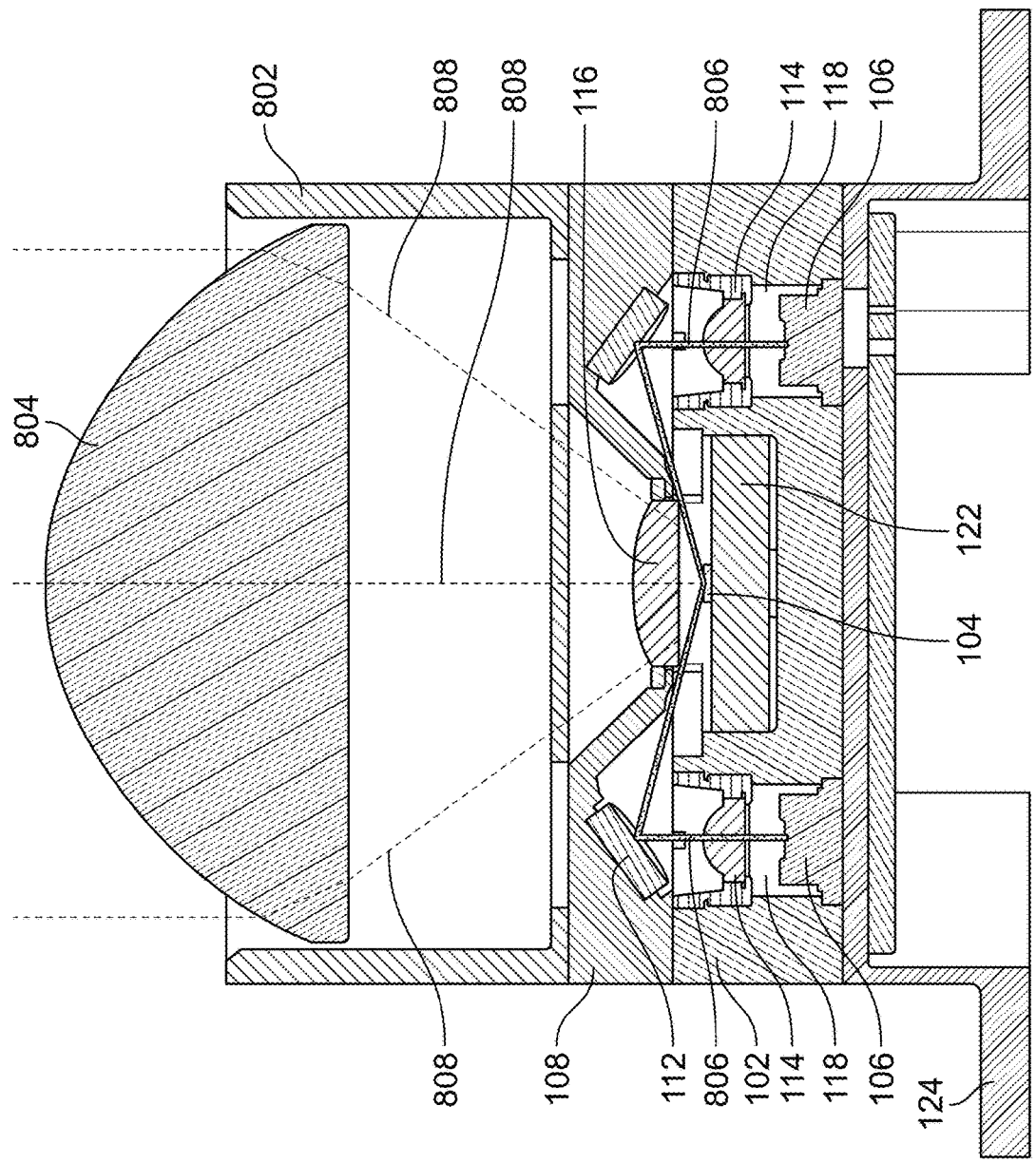
FIG. 8 depicts a cross section view of another embodiment of a compact laser light assembly.

Referring now to FIG. 8, it is seen that in some embodiments the laser light assembly may additionally include a lens housing 802 and a second lens 804. When included, the lens housing 802 is coupled to the light shield 108. The second lens 804 is mounted at least partially in the lens housing 802, is spaced apart from the first lens 116, and is disposed to receive and collimate the white light that passes through the first lens 116. Although the second lens 804 may be variously implemented, in a particular preferred embodiment, it is implemented using a collimating lens.

For completeness, FIG. 8 also depicts the blue laser light 806 that is emitted by each of the laser diodes 106, and that passes through the beam-shaping lenses 114 and is reflected by the at least one mirror 112 toward the predetermined position 202 on the reflective phosphor plate 104. FIG. 8 also depicts the white light 808 that is emitted by the reflective phosphor plate 104, and that is received and collimated by the first and second lenses 116, 804.

The laser light assembly described herein provides a relatively high-output light source, while being smaller, lighter in weight, and simpler in configuration as compared to existing light sources.

In this document, relational terms such as first and second, and the like may be used solely to distinguish one entity or action from another entity or action without necessarily requiring or implying any actual such relationship or order between such entities or actions. Numerical ordinals such as "first," "second," "third," etc. simply denote different singles of a plurality and do not imply any order or sequence unless specifically defined by the claim language. The sequence of the text in any of the claims does not imply that process steps must be performed in a temporal or logical order according to such sequence unless it is specifically defined by the language of the claim. The process steps may be interchanged in any order without departing from the scope of the invention as long as such an interchange does not contradict the claim language and is not logically nonsensical.

Furthermore, depending on the context, words such as "connect" or "coupled to" used in describing a relationship between different elements do not imply that a direct physical connection must be made between these elements. For example, two elements may be connected to each other physically, electronically, logically, or in any other manner, through one or more additional elements.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. A laser light assembly, comprising:
    a substrate;
    a reflective phosphor plate coupled to the substrate, the reflective phosphor plate configured to convert incident blue laser light into white light;
    a plurality of laser diodes mounted on the substrate and evenly spaced about a radius that is measured from a predetermined position on the reflective phosphor plate, each laser diode configured to emit blue laser light;
    a light shield coupled to the substrate and configured to prevent the blue laser light emitted by the plurality of laser diodes from escaping the assembly;
    at least one mirror disposed between the light shield and the plurality of laser diodes, the at least one mirror spaced apart from the plurality of laser diodes and the reflective phosphor plate and disposed to reflect the blue laser light emitted from each laser diode toward the predetermined position on the reflective phosphor plate, whereby the reflective phosphor plate emits white light;
    a plurality of beam-shaping lenses mounted on the substrate, each beam-shaping lens disposed between a different one of the laser diodes and the at least one mirror; and
    a first lens mounted on the light shield, the first lens spaced apart from the reflective phosphor plate and disposed to receive the white emitted from the reflective phosphor plate.

2. The laser light assembly of claim 1, wherein each beam-shaping lens is a focusing lens.

3. The laser light assembly of claim 1, wherein:
the substrate has a plurality of openings formed therein; and
each of the plurality of laser diodes is disposed within a different one of the openings.

4. The laser light assembly of claim 3, wherein each beam-shaping lens is disposed within a different one of the plurality of openings.

5. The laser light assembly of claim 1, wherein the light shield comprises a material selected from the group consisting of steel, aluminum, and opaque plastic.

6. The laser light assembly of claim 1, further comprising:
a second lens spaced apart from the first lens and disposed to receive and collimate the white light that passes through the first lens.

7. The laser light assembly of claim 1, wherein the first lens and the second lens are each collimating lenses.

8. The laser light assembly of claim 1, further comprising:
a lens housing coupled to the shield, the lens housing having the second lens mounted at least partially therein.

9. The laser light assembly of claim 1, further comprising:
a mount plate disposed in and coupled to the substrate, the mount plate having the reflective phosphor plate mounted thereon.

10. The laser light assembly of claim 1, wherein:
the at least one mirror comprises a plurality of mirrors;
each mirror is associated with and is spaced apart from a different one of the plurality of laser diodes; and
each mirror is disposed to reflect the laser light emitted from its associated laser diode toward the predetermined position on the reflective phosphor plate.

11. The laser light assembly of claim 1, further comprising:
a mount flange coupled to the substrate and configured to mount the laser light assembly on a surface.

12. The laser light assembly of claim 1, wherein:
the blue laser light emitted by each of the plurality of laser diodes is reflected by the at least one mirror in an individual elliptical pattern toward the predetermined position on the reflective phosphor plate; and
each of the individual elliptical patterns collectively forms a substantially circular pattern at the predetermined position on the reflective phosphor plate.

13. A laser light assembly, comprising:
a substrate having a plurality of openings formed therein, the plurality of openings evenly spaced about a radius that is measured from a predetermined position;
a reflective phosphor plate coupled to the substrate and having the predetermined position thereon, the reflective phosphor plate configured to convert incident blue laser light into white light;
a plurality of laser diodes, each laser diode disposed within a different one of the plurality of openings, and each laser diode configured to emit blue laser light;
a light shield coupled to the substrate and configured to prevent the blue laser light emitted by the plurality of laser diodes from escaping the assembly;
at least one mirror disposed between the light shield and the plurality of laser diodes, the at least one mirror spaced apart from the plurality of laser diodes and the reflective phosphor plate and disposed to reflect the blue laser light emitted from each laser diode toward the predetermined position on the reflective phosphor plate, whereby the reflective phosphor plate emits white light;
a plurality of beam-shaping lenses, each beam-shaping lens disposed within a different one of the plurality of openings and disposed between a different one of the laser diodes and the at least one mirror;
a first collimating lens mounted on the shield, the first collimating lens spaced apart from the reflective phosphor plate and disposed to receive and collimate the white emitted from the reflective phosphor plate;
a lens housing coupled to the shield; and
a second collimating lens mounted at least partially in the lens housing and spaced apart from the first collimating lens, the second collimating lens disposed to receive and collimate the white light that passes through the first collimating lens.

14. The laser light assembly of claim 13, wherein the light shield comprises a material selected from the group consisting of steel, aluminum, and opaque plastic.

15. The laser light assembly of claim 13, further comprising:
a mount plate disposed in and coupled to the substrate, the mount plate having the reflective phosphor plate mounted thereon.

16. The laser light assembly of claim 13, further comprising:
a mount flange coupled to the substrate and configured to mount the laser light assembly on a surface.

17. The laser light assembly of claim 13, wherein:
the at least one mirror comprises a plurality of mirrors;
each mirror is associated with and is spaced apart from a different one of the plurality of laser diodes; and
each mirror is disposed to reflect the laser light emitted from its associated laser diode toward the predetermined position on the reflective phosphor plate.

18. The laser light assembly of claim 13, wherein:
the blue laser light emitted by each of the plurality of laser diodes is reflected by the at least one mirror in an individual elliptical pattern toward the predetermined position on the reflective phosphor plate; and
each of the individual elliptical patterns collectively forms a substantially circular pattern at the predetermined position on the reflective phosphor plate.

19. A laser light assembly, comprising:
a substrate having a plurality of openings formed therein, the plurality of openings evenly spaced about a radius that is measured from a predetermined position;
a reflective phosphor plate coupled to the substrate and having the predetermined position thereon, the reflective phosphor plate configured to convert incident blue laser light into white light;
a plurality of laser diodes, each laser diode disposed within a different one of the plurality of openings, and each laser diode configured to emit blue laser light;
a light shield coupled to the substrate and configured to prevent the blue laser light emitted by the plurality of laser diodes from escaping the assembly;
a plurality of mirrors mounted on the light shield, each mirror associated with and spaced apart from a different one of the plurality of laser diodes, each mirror disposed to reflect the blue laser light emitted from its associated laser diode toward the predetermined position on the reflective phosphor plate, whereby the reflective phosphor plate emits white light;
a plurality of beam-shaping lenses, each beam-shaping lens disposed within a different one of the plurality of openings and disposed between a different one of the laser diodes and the at least one mirror;

a first collimating lens mounted on the shield, the first lens spaced apart from the reflective phosphor plate and disposed to receive and collimate the white emitted from the reflective phosphor plate;

a lens housing coupled to the shield; and a second collimating lens mounted at least partially in the lens housing and spaced apart from the first collimating lens, the second collimating lens disposed to receive and collimate the white light that passes through the first collimating lens, wherein:

the blue laser light emitted by each of the plurality of laser diodes is reflected by its associated mirror in an individual elliptical pattern toward the predetermined position on the reflective phosphor plate, and each of the individual elliptical patterns collectively forms a substantially circular pattern at the predetermined position on the reflective phosphor plate.

\* \* \* \* \*